United States Patent
Alghamdi et al.

(10) Patent No.: US 10,210,999 B2
(45) Date of Patent: Feb. 19, 2019

(54) DYE-SENSITIZED SOLAR CELL INCLUDING A SEMICONDUCTING NANOCOMPOSITE

(71) Applicant: Imam Abdulrahman Bin Faisal University, Dammam (SA)

(72) Inventors: Jwaher Mohammed Alghamdi, Dammam (SA); Mohammed Ashraf Gondal, Dammam (SA)

(73) Assignees: Imam Abdulrahman Bin Faisal University, Dammam (SA); KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 15/855,548

(22) Filed: Dec. 27, 2017

(65) Prior Publication Data

US 2018/0182562 A1 Jun. 28, 2018

Related U.S. Application Data

(60) Provisional application No. 62/439,375, filed on Dec. 27, 2016.

(51) Int. Cl.
*H01G 9/20* (2006.01)
*H01L 51/42* (2006.01)
*H01L 51/44* (2006.01)

(52) U.S. Cl.
CPC ......... *H01G 9/2059* (2013.01); *H01G 9/2013* (2013.01); *H01G 9/2022* (2013.01); *H01L 51/426* (2013.01); *H01L 51/441* (2013.01)

(58) Field of Classification Search
CPC .. H01G 9/2059; H01G 9/2013; H01G 9/2022; H01G 9/2031; H01L 51/426; H01L 51/441

See application file for complete search history.

(56) References Cited

U.S. PATENT DOCUMENTS

| | | | |
|---|---|---|---|
| 6,376,765 B1* | 4/2002 | Wariishi | H01G 9/2009 136/256 |
| 6,469,243 B2 | 10/2002 | Yamanaka et al. | |
| 8,013,241 B2* | 9/2011 | Koumura | H01B 1/122 136/263 |
| 8,603,849 B2* | 12/2013 | Kim | H01L 31/18 136/261 |

(Continued)

FOREIGN PATENT DOCUMENTS

| JP | 2015-79628 A | 4/2015 |
|---|---|---|
| KR | 10-2008-0052082 A | 6/2008 |

OTHER PUBLICATIONS

Reiss et al. ("Core/Shell Semiconductor Nanocrystals," Small 2009, No. 2, 154-168) (Year: 2009).*

(Continued)

*Primary Examiner* — Susan D Leong

(74) *Attorney, Agent, or Firm* — Oblon, McClelland, Maier & Neustadt, L.L.P.

(57) ABSTRACT

A semiconducting nanocomposite and a dye-sensitized solar cell including the same, wherein the semiconducting nanocomposite comprises nanocomposite particles selected from the group consisting of $TiO_2/ZnO/CdS$, $TiO_2/ZnO/CdSe$, $TiO_2/ZnO/PbS$, $TiO_2/ZnO/PbSe$, $TiO_2/ZnS/CdSe$, $TiO_2/ZnS/PbS$, $TiO_2/ZnS/PbSe$, $WO_3/ZnO/CdSe$, $Nb_2O_5/ZnO/CdSe$, and combinations thereof. Various embodiments of each component of the dye-sensitized solar cell, including electrodes, conductive layers, dyes, and electrolytes are also provided.

19 Claims, 1 Drawing Sheet

(56) References Cited

U.S. PATENT DOCUMENTS

| | | | |
|---|---|---|---|
| 9,111,687 B2* | 8/2015 | Yeh | H01G 9/2004 |
| 2005/0260786 A1 | 11/2005 | Yoshikawa et al. | |
| 2011/0048511 A1* | 3/2011 | Inoue | H01G 9/2022 |
| | | | 136/252 |
| 2013/0081686 A1 | 4/2013 | Martinson et al. | |
| 2015/0262760 A1* | 9/2015 | Qi | H01G 9/2031 |
| | | | 136/254 |
| 2015/0333201 A1* | 11/2015 | Sargent | H01L 31/0324 |
| | | | 136/250 |
| 2016/0217936 A1* | 7/2016 | Fukui | H01L 51/0072 |

OTHER PUBLICATIONS

Kuppuswamy Kalyanasundaram, et al., "Efficient Dye-Sensitized Solar Cells for Direct Conversion of Sunlight to Electricity", Material Matters, vol. 4.4, 2009, 6 pages.

A. C. Nwanya, et al., "Dyed sensitized solar cells: A technically and economically alternative concept to p-n junction photovoltaic devices", International Journal of the Physical Sciences, vol. 6, No. 22, Oct. 2, 2011, pp. 5190-5201.

Mingkui Wang, et al., "Recent developments in redox electrolytes for dye-sensitized solar cells", Energy & Environmental Science, vol. 5, Sep. 13, 2012, pp. 9394-9405.

Sadia Ameen, et al., "Metal Oxide Nanomaterials, Conducting Polymers and Their Nanocomposites for Solar Energy", Intech, Solar Cells—Research and Application Perspectives, Chapter 8, 2013, pp. 203-259.

Monishka Rita Narayan, "Review: Dye sensitized solar cells based on natural photosensitizers", Renewable and Sustainable Energy Reviews, vol. 16, 2012, pp. 208-215.

Michael Grätzel, "Dye-sensitized solar cells", Journal of Photochemistry and Photobiology C: Photochemistry Reviews, vol. 4, 2003, pp. 145-153.

* cited by examiner

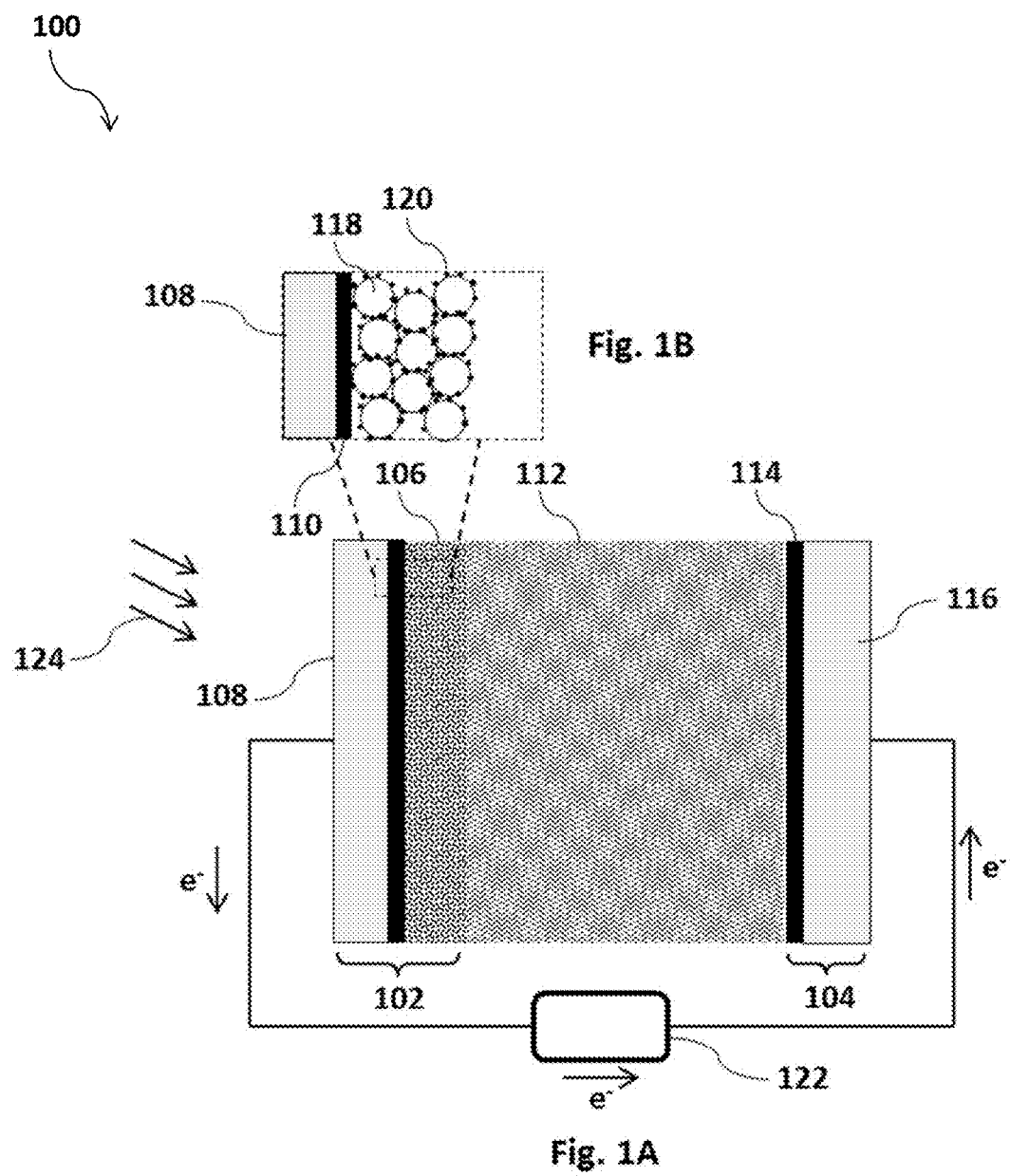

DYE-SENSITIZED SOLAR CELL INCLUDING A SEMICONDUCTING NANOCOMPOSITE

CROSS-REFERENCE TO RELATED APPLICATIONS

This application is based on, and claims the benefit of priority to, provisional application No. 62/439,375, filed Dec. 27, 2016, the entire contents of which are incorporated herein by reference.

BACKGROUND OF THE INVENTION

Technical Field

The present invention relates to a dye-sensitized solar cell having a semiconductor layer that comprises nanocomposite particles selected from the group consisting of $TiO_2/ZnO/CdS$, $TiO_2/ZnO/CdSe$, $TiO_2/ZnO/PbS$, $TiO_2/ZnO/PbSe$, $TiO_2/ZnS/CdSe$, $TiO_2/ZnS/PbS$, $TiO_2/ZnS/PbSe$, $WO_3/ZnO/CdSe$, $Nb_2O_5/ZnO/CdSe$, and combinations thereof.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In recent years, environmental issues such as global warming became a serious issue, and measures against such environmental issues have been taken on a global basis. Above all, solar cells that utilize solar energy have been actively investigated and developed as a means to produce clean energy. Among the solar cells, mono-crystal silicon solar cells, poly-crystal silicon solar cells, amorphous silicon solar cells, and compound-semiconductor solar cells have already been practically used, but these solar cells have been produced with a relatively high production cost.

More recently, dye-sensitized solar cells (DSSC) have been developed as inexpensive alternatives to the currently available silicon-based solar cells. DSSC is a photo-electrochemical cell that mimics the solar energy conversion in plants. A dye-sensitized solar cell generally consists of a working electrode (i.e. anode) having a photosensitizing function (e.g. provided by a semiconductor layer), a counter electrode (i.e. cathode) disposed across from the working electrode with a space provided therebetwveen, and a liquid electrolyte containing a redox couple that fills in between the two electrodes. Dye molecules present on the anode turn into an excited state by absorbing incident photons, thereby causing a release of an electron into the conduction band of the semiconductor layer of the anode. This process creates a potential difference and subsequently a flow of electron through an external circuit to the counter electrode. At the interface counter electrode/electrolyte, the electron is given back to the dye molecules through a redox reaction.

Dye-sensitized solar cells can be produced in lower cost compared to silicon-based solar cells. Furthermore, DSSCs are more flexible in terms of design than silicon-based solar cells, and generally provides a higher photon to electricity conversion efficiency. In addition, DSSCs are less sensitive to temperature fluctuations, whereas silicon-based solar cells may exhibit a substantial drop in performance (e.g. 20% change) [Review: Dye-sensitized solar cells, Gratzel Michael. 2003, Journal of Photochemistry and Photobiology C: Photochemciatry Reviews, Vol. 4, pp. 145-153].

Numerous efforts have been performed to increase the efficiency of DSSCs by modifications on each of the components of the DSSCs. In terms of an electrolyte for a DSSC, iodide ($I^-$)/tri-iodide ($I_3^-$) is one of the most commonly used redox electrolytes in a regular DSSC, but recently many other solid and semisolid and polymeric materials have been used [Tachibana Y, Haque S A, Mercer I P, Durrant J R, Klug D R, Electron injection and recombination in dye sensitized nanocrystalline titanium dioxide films: a comparison of rutheniumbipyridyl and porphyrin sensitizer dyes, Journal of Physical Chemistry B. 2000, 104, pp. 1198-1205; Arango A C, Johnson L R., Bliznyuk V N, Schlesinger Z, Carter S A, H"orhold H H, Efficient titanium oxide/conjugated polymer photovoltaics for solar energy conversion, Advanced Materials, 2000, 12, pp. 1689-92]. The redox electrolyte conventionally used in DSSCs was shown to have a poor stability due to leakage and evaporation or flammability of the liquid electrolyte. Some researchers have used polymer based gel type electrolytes due to their ionic conductivity and flexibility, and to avoid the drawback of liquid electrolytes. However, the obtained conversion efficiencies are relatively poor [Zhang Lan, Jihuai Wu, Jianming Lin, Miaoliang Huang. Quasi-solid-state dyesensitized solar cell based on a polymer gel electrolyte with in situ synthesized ionic conductors. Comptes Rendus Chimie. 2010, Vol. 13, pp. 1401-1405]. In a recent study, an increase in the efficiency of DSSCs was reported by the use of polyvinylidene fluoride (PVdF) based gel [Arof A K, Aziz M F, Noor M M, Careem M A, Bandara LRAK, Thotawatthage C A, et al. Efficiency enhancement by mixed cation effect in dye-sensitized solarcells with a PVdF based gel polymer electrolyte, International Journal of Hydrogen Energy. 2014, vol. 39, pp. 2929-2935]. In addition, Yella et al. has reported an efficiency of about 12% for a DSSC by replacing the conventional iodide ($I^-$)/tri-iodide ($I_3^-$) redox mediator by Co(II/III) redox electrolyte which remarkably possesses higher reduction potential [Aswani Yella, H-Isuan-Wei Lee, Hoi Nok Tsao, Chenyi Yi, Aravind Kumar Chandiran, Md. Khaja Nazeeruddin, Eric Wei-Guang Diau, Chen-Yu Yeh, Shaik M Zakeeruddin, Michael Grätzel. Prophyrin-Sensitized Solar Cells with Cobalt (II/III) Based Redox Electrolyte Exceed 12 Percent Efficiency, Science, 2011, Vol. 334, pp 629-63].

However, it has been shown that photon to electricity conversion efficiency of a DSSC is considerably affected by the semiconductor layer. Therefore, several investigations have been performed on semiconducting materials used in DSSCs to increase their efficiency. The photon to electricity conversion efficiency of a regular DSSC is around 7-12%, whereas an efficiency of more than 15% would make this technology suitable for electricity production in a large scale. Accordingly, several semiconducting materials with various morphologies have been tested in a DSSC. For example, nanostructures such as nanorods, nanotubes, nanowires, nano-leaves or their combination has been made up on transparent conductive oxide electrode [Noshin Mir, Masoud Salavati-Niasari; Photovoltaic properties of corresponding dye-sensitized solar cells: Effect of active sites of growth controller on $TiO_2$ nanostructures. Solar Energy. 2012, Vol. 86, pp. 3397-3404]. In another investigation, $TiO_2$ have been used in both phases of anatase and rutile in a DSSC [Comparison of dye-sensitized rutile- and anatase-based $TiO_2$ solar cells. Park N G, vande Lagemaat J, Frank A J. 2000, Journal of Physical Chemisrty B, Vol. 104, pp. 8989-94]. ZnO was also shown to be a promising semiconducting material due to its high porosity, band structure, and high electron mobility. Accordingly, in some investigations ZnO was incorporated into a DSSC as the semiconducting material and the effect of ZnO on the performance of a DSSC was determined [By Qifeng Zhang, Christopher S. Dandeneau, Xiaoyuan Zhou, and Guozhong Cao, ZnO Nanostructures for Dye-Sensitized Solar Cells, Advanced Materials. 2009, Vol. 21, pp. 4087-4108; J B Baxter, AMWalker, K vanOmmering and E S Aydil, Synthesis and characterization of ZnO nanowires and their integration into dye-sensitized solar cells, Nanotechnology, 2006, Vol. 17, pp. S304-S312; Juan A. Anta, Elena Guillen, and Ramón Tena-Zaera, ZnO-Based Dye-Sensitized Solar Cells, The Journal of Physical Chemistry C. 2012, Vol. 116, pp. 11413-11425]. ZnO in the form nanosheets has also been applied to DSSCs [Li Hui, Yu Zhang, Wang John, ZnO nanosheets derived from surfactant directed process: growth mechanism and application in dye-sensitized solar cells, Journal of the American Ceramic Society. 2012, Vol. 95, pp. 1241-1246]. In addition, electrochemical deposition techniques have been utilized to fabricate ZnO for DSSC in different structures such as: well-aligned arrays of vertically oriented ZnO nanowires [O. Lupana, V. M. Guérin, I. M. Tiginyanu, V. V. Ursaki, L. Chow, H. Heinrich, T. Pauporte, Well-aligned arrays of vertically oriented ZnO nanowires electrodeposited on ITO-coated glass and their integration in dye-sensitized solar cells, Journal of Photochemistry and Photobiology A, Chemistry, 2010, Vol. 211, pp. 65-73], and also as mesoporous thin films for highly efficient DSSCs [F. Anderson S. Lima, Igor F. Vasconcelos, M. Lira-Cantu, Electrochemically synthesized mesoporous thin films of ZnO for highly efficient dye-sensitized solar cells, Ceramics International. 2015, Vol. 41, pp. 9314-9320]. In a separate study, the morphology impact of nanostructures of ZnO films on the efficiency on DSSC was studied [Giannouli M, Spiliopoulou F. Effects of the morphology of nanostructured ZnO films on the efficiency of dye-sensitized solar cells. Renew Energy. 2012, Vol. 41, pp. 115-122]. It has been shown that high electron mobility and large band gap of tin dioxide ($SnO_2$) made it a superior semiconducting material to $TiO_2$ [QianJ, LiuP, XiaoY, JiangY, CaoY, AiX, Yang H. $TiO_2$-Coated Multilayered $SnO_2$ Hollow Micro spheres for dye-sensitized solar cells, Advanced Materials. 2009, Vol. 21, 36, pp. 3663-7], however, the efficiency of $SnO_2$ in DSSC is less than that of $TiO_2$ [Fukai Y, Kondo Y, Mori S, Suzuki E. High efficiency dye-sensitized $SnO_2$ having sufficient electron diffusion length, Electrochemistry Communications. 2007, Vol. 9, 7, pp. 1439-1443]. It was shown that when a narrow-band semiconducting material (such as CdS, CdSe, PbS, etc.) is added to the mesoporous $TiO_2$ electrode of a DSSC, a light harvesting efficiency of the DSSC increases [Taye Zewdu, a John N. Clifford, Javier Perez Hernandez, and Emilio Palomares. Photo-induced charge transfer dynamics in efficient $TiO_2$/CdS/CdSe sensitized solar cells, Energy & Environmental Science. 2011, Vol. 4, pp. 4633-4638; Diego Esparza, Isaac Zarazila, Tzarara López-Luke, Andrea Cerdan-Pasaran, Ana Sinchez-Solis, Alejandro Torres-Castro, Ivan Mora-Sero, and Elder De la Rosa. Effect of Different Sensitization Technique on the Photoconversion Efficiency of CdS Quantum Dot and CdSe Quantum Rod Sensitized $TiO_2$ Solar Cells. The Journal of Physical Chemistry C. 2015, Vol. 119, pp. 13394-13403].

In view of the forgoing, one objective of the present invention is to provide a dye-sensitized solar cell having a semiconductor layer that comprises nanocomposite particles selected from the group consisting of $TiO_2$/ZnO/CdS, $TiO_2$/ZnO/CdSe, $TiO_2$/ZnO/PbS, $TiO_2$/ZnO/PbSe, $TiO_2$/ZnS/CdSe, $TiO_2$/ZnS/PbS, $TiO_2$/ZnS/PbSe, $WO_3$/ZnO/CdSe, $Nb_2O_5$/ZnO/CdSe, and combinations thereof.

BRIEF SUMMARY OF THE INVENTION

According to a first aspect the present disclosure relates to a dye-sensitized solar cell, including i) an anode that includes a transparent substrate, and a transparent conductive layer arranged on the transparent substrate, ii) a cathode, iii) a semiconductor layer and a dye absorbed thereon, wherein the semiconductor layer is arranged between the anode and the cathode in the vicinity to or in contact with the anode, iv) an electrolyte located between the anode and the cathode, wherein the semiconductor layer comprises nanocomposite particles selected from the group consisting of $TiO_2$/ZnO/CdS, $TiO_2$/ZnO/CdSe, $TiO_2$/ZnO/PbS, $TiO_2$/ZnO/PbSe, $TiO_2$/ZnS/CdSe, $TiO_2$/ZnS/PbS, $TiO_2$/ZnS/PbSe, $WO_3$/ZnO/CdSe, $Nb_2O_5$/ZnO/CdSe, and combinations thereof.

In one embodiment, the semiconductor layer is deposited on the anode.

In one embodiment, said nanocomposite particles are at least one selected from the group consisting of $TiO_2$/ZnO/CdS, and $TiO_2$/ZnO/CdSe.

In one embodiment, said nanocomposite particles are at least one selected from the group consisting of $TiO_2$/ZnO/PbS and $TiO_2$/ZnO/PbSe.

In one embodiment, said nanocomposite particles are in the form of quantum dots.

In one embodiment, said nanocomposite particles are in the form of core-shell quantum dots.

In one embodiment, the anode and the cathode are planar and are disposed parallel and across from one another.

In one embodiment, the semiconductor layer is porous having a pore diameter in the range of 100 nm-50 μm.

In one embodiment, a thickness of the semiconductor layer is within the range of 0.5-50 μm.

In one embodiment, the dye is at least one selected from the group consisting of a ruthenium complex, a xanthene-based pigment, a cyanine-based pigment, a phosphirine-based compound, an azo pigment, an anthraquinone-based pigment, and a polycyclic quinine-based pigment.

In one embodiment, the dye is covalently bonded to said nanocomposite particles.

In one embodiment, the cathode includes i) a second transparent substrate, and ii) a reflective conducting layer on the second transparent substrate, wherein the reflective conducting layer comprises at least one metal selected from the group consisting of gold, platinum, silver, copper, aluminum, zinc, nickel, iron, tin, and lead.

In one embodiment, the reflective conducting layer has a reflectance of at least 70%, when being exposed to an incident beam having a wavelength in the range of 300-1,000 nm.

In one embodiment, the electrolyte includes at least one halogenated metal salt and/or at least one halogenated nitrogen-containing heterocyclic compound.

In one embodiment, the electrolyte further includes a plurality of functionalized inorganic nanoparticles selected from the group consisting of titanium dioxide, silicon dioxide, zinc oxide, aluminum oxide, cadmium sulfide, zirconium oxide, calcium phosphate, and calcium oxide, wherein said inorganic nanoparticles are functionalized with at least one substituent selected from the group consisting of a silane, an ether, an amine, an ester, and an amide.

In one embodiment, the electrolyte is at least one conductive polymer selected from the group consisting of polypyrrole, polyaniline, polythiophene, poly(3,4-ethylene-dioxy-thiophene), poly(3-alkylthiophenes), polyacetylene, polyphenylene vinylene, and polyphenylene sulfide.

In one embodiment, the electrolyte is a crosslinked polymer which is swollen by an electrolyte solution having a dielectric constant within the range of 1-200.

In one embodiment, the electrolyte solution includes an ionic liquid having a boiling point of at least 120° C.

In one embodiment, the electrolyte solution includes i) an organic solvent having a boiling point of at least 120° C., and ii) at least one halogenated metal salt and/or at least one halogenated nitrogen-containing heterocyclic compound.

According to a second aspect the present disclosure relates to a dye-sensitized solar cell, including i) an anode that includes a transparent substrate, and a transparent conductive layer arranged on the transparent substrate, ii) a cathode, iii) a semiconductor layer and a dye absorbed thereon, wherein the semiconductor layer is deposited on the anode, and iv) an electrolyte located between the semiconductor layer and the cathode, wherein the semiconductor layer comprises nanocomposite particles selected from the group consisting of $TiO_2$/ZnO/CdS, $TiO_2$/ZnO/CdSe. $TiO_2$/ZnO/PbS, $TiO_2$/ZnO/PbSe, $TiO_2$/ZnS/CdSe, $TiO_2$/ZnS/PbS, $TiO_2$/ZnS/PbSe, $WO_3$/ZnO/CdSe, $Nb_2O_5$/ZnO/CdSe, and combinations thereof.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1A illustrates a dye-sensitized solar cell.

FIG. 1B is a magnified illustration of a cross-section of an anode of the dye-sensitized solar cell.

DETAILED DESCRIPTION OF THE EMBODIMENTS

Referring now to the drawings, wherein like reference numerals designate identical or corresponding parts throughout the several views.

According to a first aspect the present disclosure relates to a dye-sensitized solar cell 100 (DSSC), including an anode 102.

A dye-sensitized solar cell 100 refers to an electrical device that converts the energy of light directly into electricity (i.e. a photoelectric conversion mechanism) by a photovoltaic effect. A dye-sensitized solar cell mainly includes a transparent substrate (or anode), a semiconductor layer, dye molecules, an electrolyte and a counter electrode (or cathode). The photoelectric conversion mechanism thereof is as follows. When sunlight reaches the DSSC, the dye molecules absorb energy from sunlight, and electrons in the dye molecules are excited and transit to an excited state. The electrons in the excited state are rapidly injected into a conduction band of the semiconductor layer, and thus the dye molecules are transformed to an oxidized state due to a loss of electrons. The electrons injected into the conduction band of the semiconductor layer, instantly reach a contact interface between the semiconductor layer and the transparent substrate of the anode, accumulate on the anode, and flow to the counter electrode (or cathode) through an outer circuit including a load 122. The dye molecules in the oxidized state accept electrons from an electron donor in the electrolyte and return to the ground state, thereby regenerating the dye molecules. After losing its electron, the electron donor in the electrolyte diffuses to the counter electrode and accepts an electron and is reduced. In this way, a photoelectric chemical reaction cycle is completed. The counter electrode is mainly used for collecting electrons and accelerating the electron exchange rate between the electrolyte and counter electrode.

The anode 102 includes a transparent substrate 108, and a transparent conductive layer 110 arranged on the transparent substrate 108.

A material for forming the transparent substrate 108 may be any one of various transparent materials that enable external light to pass therethrough. Accordingly, the transparent substrate 108 may be formed of inorganic materials or plastic materials. Examples of the plastic materials include, but are not limited to polyethylene terephthalate, polybutylene terephthalate, polyethylene-2,6-naphthalate, polycarbonate, triacetyl cellulose, liquid crystal polymers such as thermotropic liquid crystal polyester and thermotropic liquid crystal polyester amide, acrylic resins such as polyacrylate and polymethacrylate, olefin resins such as polyethylene and polypropylene, vinyl resins such as polyvinyl chloride, an ethylene-vinyl acetate copolymer, and an ethylene-vinyl alcohol copolymer, imide resins such as polyimide and polyamide-imide, and ether resins such as polyethernitrile and polyether sulfone. These plastic materials may be used alone or may be used in combination of two or more. The transparent substrate 108 may be doped with a material selected from the group consisting of Ti, In, Ga, and Al. Examples of the inorganic materials include, but not limited to silicon dioxide, aluminum oxide, silicon nitride, aluminum, nitride, and boron nitride. These inorganic materials may be used alone or may be used in combination of two or more. In one embodiment, the transparent substrate 108 is flexible and is formed into a flat plate shape. In one embodiment, a thickness of the transparent substrate 108 is within the range of 5 to 500 μm, preferably 10 to 400 μm, more preferably 50 to 400 μm.

The transparent conductive layer 110 is disposed on the transparent substrate 108 of the anode 102. The transparent conductive layer 110 may include a conductive metal oxide selected from the group consisting of indium tin oxide (ITO), fluorine tin oxide (FTO), ZnO—($Ga_2O_3$ or $Al_2O_3$), a tin-based oxide, an antimony tin oxide (ATO), zinc oxide, and a mixture thereof. The transparent conductive layer 110 may further include a conductive material such as gold, silver, copper, platinum, nickel, tin, and aluminum, a composite metal oxide such as tin-doped indium oxide (ITO), fluorine-doped tin oxide (FTO), and zinc-doped indium oxide (IZO), and a carbon material such as graphite, graphene, and carbon nanotubes. These conductive materials may be used alone, or may be used in combination of two or more. For example, in one embodiment, indium tin oxide (ITO) may be used alone, or in another embodiment, a composite layer of indium tin oxide (ITO) and a metal is used to reduce an electrical resistance after heat treatment. The transparent conductive layer 110 may be a single layer film or a multi-layer film. In one embodiment, a resistivity of the transparent conductive layer 110 is less than 0.01 Ω·cm, or preferably less than, or more preferably less than 0.005 Ω·cm. In another embodiment, the thickness of the transparent conductive layer 110 is within the range of 0.01 to 100 µm, or preferably 0.1 to 10 µm. A ratio of the thickness of the transparent conductive layer 110 to the thickness of the transparent substrate 108 is in the range of 1:5 to 1:20, preferably 1:5 to 1:15, more preferably about 1:10.

The anode 102 may be fabricated by forming the transparent conductive layer 110 including the conductive material (listed above) on the transparent substrate 108 using electroplating and/or physical vapor deposition (PVD) such as sputtering or electron beam deposition.

The dye-sensitized solar cell 100 further includes a cathode 104. In one embodiment, the cathode 104 includes a second transparent substrate 116 and a reflective conducting layer 114 on the second transparent substrate 116.

The cathode 104 (also called a counter electrode) is disposed facing the side of the anode 102 with a semiconductor layer 106 thereon. In one embodiment, the anode 102 and the cathode 104 are planar and are disposed parallel and across from one another. In another embodiment, the anode and the cathode are in the form of hollow cylinders having a common longitudinal axis. The anode and the cathode may also have a rectangular geometry.

The cathode 104 may be formed of a conductive material selected from the group consisting of gold, platinum, silver, copper, aluminum, zinc, nickel, iron, tin, and lead. These conductive materials may be used alone, or may be used in combination of two or more.

Furthermore, an insulating material may also be used to form the cathode as long as a conductive layer, preferably the reflective conducting layer 114, is present in the cathode. In one embodiment, an electrochemically stable material may be used to form the cathode, and in particular, platinum, gold, or carbon may be used. Also, to improve catalytic effects to oxidation and reduction, a portion of the cathode that faces the anode may have a microstructure with an increased surface area. For example, platinum may be used in the form of platinum black, and carbon is used in a porous state. The platinum black may be formed by anodizing platinum or treating platinum with a chloroplatinic acid, and a porous carbon may be formed by sintering carbon fine particles or calcining an organic polymer.

In one embodiment, the reflective conducting layer 114 comprises at least one metal selected from the group consisting of gold, platinum, silver, copper, aluminum, zinc, nickel, iron, tin, and lead. In one embodiment, the reflective conductive layer is deposited on the second transparent substrate 116 by atomic layer deposition. In one embodiment, the reflective conducting layer 114 has a reflectance of at least 70%, preferably at least 75%, more preferably at least 80%, when being exposed to an incident beam 124 having a wavelength in the range of 100-1,000 nm, preferably 200-800 nm, more preferably 300-700 nm. A resistivity of the reflective conducting layer 114 is less than $10^{-2}$ Ω·cm, preferably less than $10^{-3}$ Ω·cm, more preferably less than $10^{-5}$ Ω·cm. A thickness of the reflective conducting layer 114 is within the range of 0.1 to 100 µm, preferably 1 to 50 µm, more preferably 5 to 20 µm.

In one embodiment, the second transparent substrate 116 is substantially similar to the transparent substrate 108, as described previously.

The cathode 104 may be fabricated by forming the reflective conducting layer 114 including a conductive material (listed above) on the second transparent substrate 116 using electroplating and/or physical vapor deposition (PVD) such as sputtering or electron beam deposition.

The dye-sensitized solar cell 100 further includes a semiconductor layer 106 and a dye absorbed thereon.

The semiconductor layer 106 may have a fine and uniform porous structure, and may include nanocomposite particles 118 having a fine and uniform average particle size. The term "uniform" as used herein does not mean that porous structures of the semiconductor layer or average particle size of the nanocomposite particles are all look similar. In view of that, "a uniform porous structure" refers to pores having a pore diameter within the range of 100 nm-50 µm, preferably 500 nm-10 µm, more preferably 500 nm-5 µm. Similarly, "a uniform average particle size" refers to nanocomposite particles having an average particle size of 5 to 500 nm, preferably 5 to 200 nm, or preferably 8 to 100 nm, more preferably 10-50 nm. A surface area of the nanocomposite particles 118 of the semiconductor layer 106 may be increased by using smaller size nanocomposite particles to make more dyes adsorbed onto the surface thereof to absorb more light. Accordingly, the most preferable size of the nanocomposite particles 118 may be less than 40 nm, preferably less than 30 nm, more preferably less than 20 nm. Also, a thickness of the semiconductor layer 106 may be 15 µm or lower, for example, in a range of 1 to 15, preferably 5-15 µm. A ratio of the thickness of the semiconductor layer 106 to the thickness of the transparent substrate 108 is in the range of 1:5 to 1:20, preferably 1:5 to 1:15, more preferably about 1:10.

The nanocomposite particles 118 may be multi-component nanocomposite particles or multi-component nanocomposite particles with a perovskite structure, wherein each being an n-type semiconductor in which electrons of a conduction band, acting as a carrier, provides an anode current when excited by irradiation of light. The multi-component nanocomposite particles may be an oxide of a metal selected from the group consisting of Ti, Zr, Sr, Zn, In, Yr, La, V, Mo, W, Sn, Nb, Mg, Al, Y, Sc, Sm, Ga, and TiSr. For example, the multi-component nanocomposite particles may be $TiO_2$, $SnO_2$, ZnO, $WO_3$, $Nb_2O_5$, $TiSrO_3$, or a mixture thereof. In another embodiment, the multi-component nanocomposite particles may be anatase $TiO_2$. The nanocomposite particles are not limited to the above-mentioned materials, and the above-mentioned materials may be used individually or in combination. In a preferred embodiment, the semiconductor layer 106 comprises one or more multi-component nanocomposite particles selected from the group consisting of $TiO_2$/ZnO/CdS, $TiO_2$/ZnO/CdSe, $TiO_2$/ZnO/PbS, $TiO_2$/ZnO/PbSe, $TiO_2$/ZnS/CdSe, $TiO_2$/ZnS/PbS, $TiO_2$/ZnS/PbSe, $WO_3$/ZnO/CdSe, $Nb_2O_5$/ZnO/CdSe, wherein components of each nanocomposite particle are physically bonded without having intermetallic bonds therebetween. In the most preferred embodiment, the semiconductor layer 106 comprises $TiO_2$/ZnO/CdS, $TiO_2$/ZnO/CdSe, $TiO_2$/ZnO/PbS, and/or $TiO_2$/ZnO/PbSe. In one embodiment, a weight percent of the first component (i.e. $TiO_2$, $WO_3$, or $Nb_2O_5$) in the each nanocomposite particle is in the range of 30-80 wt %, preferably 40-70 wt %, a weight percent of the second component (i.e. ZnO or ZnS) is in the range of 10-50 wt %, preferably 20-40 wt %, and a weight percent of the third component (i.e. CdS, CdSe, PbS, or PbSe) in the each nanocomposite particle is in the range of 10-30 wt %, preferably 10-20 wt %.

In one embodiment, said nanocomposite particles 118 are in the form of quantum dots. Quantum dots are tiny particles of a semiconducting material having diameters in the range of 1-50 nm, preferably 1-20 nm, more preferably 2-10 nm. Accordingly, core-type quantum dots, core-shell quantum dots, and/or alloyed quantum dots may be incorporated in the composition of the semiconductor layer 106. Core-type quantum dots may refer to single component particles with uniform internal compositions, such as chalcogenides (i.e. selenides or sulfides) of metals (e.g. CdSe or ZnSe). Core-shell quantum dots may refer to multi-component particles having a core, which is made of a first semiconducting material, and a shell of a second semiconducting material deposited around the core. For example, in a preferred embodiment, the semiconductor layer 106 comprises core-shell quantum dots, wherein each having a titanium oxide core with zinc oxide nanowires grown on the core. In another preferred embodiment, three-layer core-shell quantum dots are used in the composition of the semiconductor layer, wherein each three-layer core-shell quantum dot comprises a metal oxide core, with the metal being selected from the group consisting of Ti, Zr, Sr, Zn, In, Yr, La, V, Mo, W, Sn, Nb, Mg, Al, Y, Sc, Sm, Ga, In, and TiSr; a metal oxide intermediate layer with the metal being selected from the group consisting of Zn, Cd, In, Al, and Ga; and an outer shell made of chalcogenides (i.e. selenides or sulfides) of a metal, with the metal being selected from the group consisting of Zn, Cd, In, Al, and Ga. Alloyed quantum dots may be formed by alloying together two or more different semiconducting materials (e.g. CdSe/ZnS, CdS/ZnS, $TiO_2$/ZnO/CdS, $TiO_2$/ZnO/CdSe, $TiO_2$/ZnO/PbS, or $TiO_2$/ZnO/PbSe). Other examples of the quantum dots that can also be present in the composition of the semiconductor layer include, but are not limited to PbS core-type quantum dots, CdSe/ZnS core-shell type quantum dots, CdSeS/ZnS alloyed quantum dots, CdTe core-type quantum dots, InP/ZnS quantum dots, and PbSe core-type quantum dots.

In one embodiment, a morphology of said nanocomposite particles 118 is at least one selected from the group consisting of a nanosphere, a nanosheet, a nanotube, a nanofiber, a nanowire, a nanodisk, a nanocube, a nanorod, a nanoring, and a nanostar.

Preferably, the nanocomposite particles 118 may be loaded on the anode 102 in an amount ranging from 40 to 100 mg/mm$^2$, preferably in an amount ranging from 60 to 80 mg/mm$^2$. While it is possible to load nanocomposite particles above and below these ranges, in some circumstances, when the nanocomposite particles are loaded in an amount of less than 40 mg/mm$^2$, the anode becomes thin, and thus leading to an increase in an optical transmission rate, which is often undesirable because the incident light cannot be utilized effectively. By contrast, in some instances, when the nanocomposite particles are loaded in an amount of over 100 mg/mm$^2$, a volume of the anode per unit area becomes too large, and thus generated electrons may be combined with holes before travelling to the cathode through an external circuit and/or a load 122. Thus, an electric current may not be generated sufficiently.

In one embodiment, the semiconductor layer 106 has a density ranging from 0.83 to 1.97 mg/mm$^3$, and more preferably ranging from 1.40 to 1.65 mg/mm$^3$, with density being defined as a ratio of the volume of the semiconductor layer to the total mass of the nanocomposite particles 118 in the semiconductor layer. While semiconductor layers having a density lower than 0.83 mg/mm$^3$ can be used and still function as intended, when the semiconductor layer density is lower than 0.83 mg/mm$^3$, nanocomposite particles 118 may not always sufficiently form a percolated path on the anode, and thereby a flow of electrons can be deteriorated. In contrast, when the semiconductor layer density is higher than 1.97 mg/mm$^3$, it eases the flow of electrons, however, a specific surface area of the semiconductor layer reduces, which can lead to a reduced amount of adsorbed dye, and thus a reduced number of excited electrons generated by incident light.

In one embodiment, the anode 102 is coated with a nanocomposite particle solution, which is prepared by dispersing the nanocomposite particles 118 in a solvent, which is at least one selected from the group consisting of alcohols, such as ethanol, isopropylalcohol, n-propylalcohol, butanol, water, dimethylacetamide, dimethylsulfoxide, and n-methylpyrrolidone. According to this embodiment, coating the anode 102 with the nanocomposite particle solution may be carried out via a method selected from the group consisting of screen printing, spray coating, doctor blade coating, gravure coating, dip coating, silk screening, painting, slit die coating, spin coating, roll coating, decalomania coating, and combinations thereof. Selection of a suitable method of coating may depend on a viscosity of the nanocomposite particle solution. However, in a preferred embodiment, a doctor blade coating method is used to coat the anode with the nanocomposite particle solution, as the doctor blade coating is capable of producing a uniform thickness coating. After coating the anode with the nanocomposite particle solution, the nanocomposite particle solution may further go through a mechanical necking process to form the semiconductor layer on the anode. The mechanical necking process preferably does not require any heat treatment. The mechanical necking process may be carried out by a method selected from the group consisting of roll pressing, single-axial pressing, multi-axial pressing, and combinations thereof. Preferably, the mechanical necking process may be performed by a roll pressing method (or by roll pressing) that can easily result in necking among particles. In one embodiment, the mechanical necking process enables a density of the semiconductor layer to be controlled by an appropriate adjustment of process conditions. The mechanical necking process may further improve a photoelectric efficiency of the dye-sensitized solar cell. Also, the mechanical necking process may enable a continuous operation, thereby reducing a production cost. In another embodiment, a method of forming the semiconductor layer is not limited to the mechanical necking process, and other manufacturing methods such as sol-gel, electrochemical deposition, pulsed laser ablation in liquids, chemical vapor deposition, physical vapor deposition, and/or micro-emulsion may also be used.

The semiconductor layer 106 is arranged between the anode 102 and the cathode 104 in the vicinity to or in contact with the anode 102. Accordingly, the semiconductor layer 106 can be placed anywhere in between the anode and the cathode which is in the vicinity of the anode. "In the vicinity of the anode" as used herein refers to a region in between the anode 102 and the cathode 104 which has less than 50%, preferably less than 40%, more preferably less than 30%, even more preferably less than 20% of the total distance between the anode and the cathode when measured from the location of the anode, with 0% being the location of the anode and 100% being the location of the cathode. However, in a preferred embodiment, the semiconductor layer 106 is deposited on the anode and thereby is in direct contact with the anode.

Dye 120, which absorbs incident light beams 124 to generate excited electrons, is adsorbed onto the semiconductor layer 106. The dye 120 may be any one of various dyes that are used in the solar cell field. For example, the dye 120 may be a ruthenium complex. However, the dye is not limited as long as it has a charge separation function and a light sensitivity. The dye may also be, in addition to the ruthenium complex, for example, a xanthine-based pigment (e.g. rhodamine B, rose bengal, eosin, or erythrocin), a cyanine-based pigment (e.g. quinocyanine, merocyanine, naphthalocyanine, or cryptocyanine), a basic dye (e.g. phenosafranine, Capri blue, thiocine, or methyleneblue), a phosphirine-based compound (e.g. chloropyl, zinc phosphirine, or magnesium phosphirine), other azo pigments, a complex compound (e.g. a phthalocyanine compound, or Ru trisbipyridyl), an anthraquinone-based pigment, or a polycyclic quinine-based pigment. These dyes may be used alone or in a combination of two or more of these. The ruthenium complex may be $RuL_2(SCN)_2$, $RuL_2(H_2O)_2$, $RuL_3$, $RuL_2$, or the like (wherein L indicates 2,2'-bipyridyl-4,4'-dicarboxylate). Other examples of the dye include porphyrin, polyene, perylene, coumarin, chinone, quinacridone, mercurochrome, squalilium, quinone, quinoneimine, triphenylmethane, riboflavin, and indigo. In one embodiment, the dye 120 is an organometallic complex having at least one transition metal selected from the group consisting of ruthenium, osmium, platinum, copper, iron, aluminum, palladium, europium, lead, iridium, etc. Since ruthenium is a platinum-based element and can form many organic metal composites, ruthenium can be used as a dye. In a preferred embodiment, the dye 120 is covalently bonded to said nanocomposite particles 118. For example, in one embodiment, the dye is selected from the group consisting of quinone, quinoneimine, quinacridone, squalilium, triphenylmethane, and indigo, which is functionalized with at least one substituent selected from the group consisting of a silane, an ether, an amine, an ester, and an amide, so the dye 120 can form chemical bonds with the nanocomposite particles 118 in the semiconductor layer, thereby facilitating transfer of the excited electrons to the conduction band of the semiconductor layer. In one embodiment, a weight ratio of the dye 120 to the nanocomposite particles 118 is 5:100, preferably 3:100, more preferably 1:100.

The dye 120 may be deposited onto the semiconductor layer 106 by spraying a dispersion solution including the dye thereto; coating the semiconductor layer with the dispersion solution via a method selected from the group consisting of screen printing, doctor blade coating, gravure coating, dip coating, silk screening, painting, slit die coating, spin coating, roll coating, decalomania coating, and combinations thereof; and/or impregnating the semiconductor layer in the dispersion solution. In one embodiment, the dispersion solution includes an organic pigment of various colors to improve absorption of long-wavelength visible light (i.e. having a wave number in the range of 600-700 nm) to improve efficiency of the dye-sensitized solar cell 100, and an organic solvent for dispersing the dye which is at least one selected from the group consisting of acetonitrile, dichloromethane, and an alcohol-based solvent. Adsorption of the dye on the semiconductor layer may require at least 12 hours, preferably at least 24 hours, after the dye is deposited on the semiconductor layer. Adsorption time may be shortened by applying heat to the semiconductor layer. The semiconductor layer may be washed and dried with an organic solvent (e.g. acetonitrile, dichloromethane, or an alcohol-based solvent), after a layer of the dye is formed on the semiconductor layer.

The dye-sensitized solar cell 100 further includes an electrolyte 112 located between the anode 102 and the cathode 104. The electrolyte 112 may be present in a liquid state or in a solid state. In a preferred embodiment, the electrolyte 112 has a viscosity of 10 to 8,000 cps (centipoises), preferably 100-8,000 cps, more preferably 1,000-8,000 cps.

In one embodiment, the electrolyte 112 comprises or is made of at least one conductive polymer selected from the group consisting of polypyrrole, polyaniline, polythiophene, poly(3,4-ethylenedioxy-thiophene), poly(3-alkylthiophenes), polyacetylene, polyphenylene vinylene, and polyphenylene sulfide. In another preferred embodiment, a glass transition temperature of said conductive polymer is in the range of −50 to 100° C., preferably −50 to 50° C., more preferably −50 to 0° C. In some preferred embodiments, the conductive polymer has a branch structure which makes it difficult to crystallize; the conductive polymer has a great interfacial adhesion with the semiconductor layer and is capable of infiltrate pore structures in the semiconductor layer 106; the conductive polymer has a great bonding strength between the anode and the cathode; and the conductive polymer is capable of dissociating metal salts and transferring ions therethrough.

In one embodiment, the electrolyte 112 comprises or is made of a crosslinked polymer. A crosslinked polymer as used herein may refer to a type of polymers that are formed upon curing monomer resins (i.e. constituent units of a polymer) having a functionality of more than two (i.e. having more than two reactive sites) to form a three-dimensional polymer network structure that cannot be reprocessed into a different shape upon heating without chemical degradation. According to this embodiment, exemplary crosslinked polymers may include, but are not limited to epoxy (e.g. an imidazole-curable epoxy with an imidazole-based curing accelerator and a metal salt, or an amine-curable epoxy), polyester, vinylester, polyimide, polyamide-imide, polyurethane, polyphenol, poly(bis-maleimide), crosslinked rubbers, crosslinked polyvinyl alcohol, crosslinked polyethylene (e.g. crosslinked hydrogels), nylon, polyhexahydrotriazine, polyisocyanurate, polyglycolide, polylactic acid, polycaprolactone, polyhydroxyalkanoate, polyhydroxybutyrate, polyethylene adipate, polybutylene succinate, poly(3-hydroxybutyrate-co-3-hydroxyvalerate), polyethylene terephthalate, polybutylene terephthalate, polytrimethylene terephthalate, and polyethylene naphthalate. In one embodiment, the term "crosslinked polymer" may also refer to a thermoplastic polymer wherein polymers chains are physically bonded together (e.g. entanglement) without any covalent bonding therebetween. In a preferred embodiment, the crosslinked polymer has an average molecular weight between crosslinks in the range of 200-10,000 g/mol, preferably 2,000-5,000 g/mol, more preferably 3,000-5,000 g/mol, even more preferably 4,000-5,000 g/mol. The "average molecular weight between crosslinks" refers to an average molecular weight of a section of a polymer chain that lies between two crosslinking points. In another preferred embodiment, a glass transition temperature of the crosslinked polymer is in the range of −50 to 100° C., preferably −50 to 50° C., more preferably −50 to 0° C. In some preferred embodiments, the crosslinked polymer has a branch structure which makes it difficult to crystallize; the crosslinked polymer has a great interfacial adhesion with the semiconductor layer and is capable of infiltrate pore structures in the semiconductor layer; the crosslinked polymer has a great bonding strength between the anode and the cathode; the crosslinked polymer is capable of dissociating metal salts and transferring ions therethrough.

In a preferred embodiment the crosslinked polymer is swollen by an electrolyte solution having a dielectric constant within the range of 1-200, preferably 1-100, more preferably 1-50. In one embodiment, a maximum electrolyte solution mass uptake by the crosslinked polymer is at least 50 wt %, or preferably at least 80 wt %, or preferably at least 100 wt %, or preferably at least 200 wt %, but no more than 300 wt %, when the crosslinked polymer is immersed in the electrolyte solution having a temperature below 50° C., preferably below 40° C., more preferably below 30° C., even more preferably around 25° C., with weight percent being relative to an initial weight of the crosslinked polymer.

In one embodiment, the electrolyte solution includes or is made of an ionic liquid having a boiling point of at least 120° C., preferably at least 140° C., more preferably at least 150° C. The ionic liquid used in the electrolyte solution may include but not limited to imidazoles. Examples of such imidazoles may include 2-methylimidazole, 2-ethyl-4-methylimidazole, 2-benzyl-4-methylimidazole, 1-(2-cyanoethyl)-2-ethyl-4-methylimidazole, 1-cyanoethyl-2-methylimidazole, 1-(2-cyanoethyl)2-phenyl-4,5-di-(cyanoethoxymethyl) imidazole, and a combination thereof. A concentration of the ionic liquid in the electrolyte solution may depend on the crosslinked polymer, if an imidazole-curable epoxy is used. For example, the concentration of the ionic liquid may be 0.1-20 parts, preferably 5-20 parts by weight per 100 parts by weight of said epoxy. If the concentration of the ionic liquid is less than 0.1 part by weight, it may difficult to form a network structure because the epoxy may not be cured, and if the concentration of the ionic liquid is more than 20 parts by weight, the epoxy may cure too rapidly, thereby it may cause severe changes to the electrolyte. Accordingly, a concentration of the ionic liquid between 0.1-20 parts per 100 parts of the imidazole-curable epoxy may result in an amorphous epoxy structure through ionic polymerization, which includes a branching free volume therein, thereby enabling transfer of metal cations and anions. Furthermore, it may be possible to use an amine curing agent having a primary and/or a secondary amine group as a curing accelerator of the electrolyte, which is an amine-curable epoxy.

In another embodiment, the electrolyte solution includes an organic solvent and at least one halogenated metal salt and/or at least one halogenated nitrogen-containing heterocyclic compound.

The organic solvent may be a non-volatile or a low-volatile organic solvent having a boiling point of at least 120° C., preferably at least 140° C., more preferably at least 150° C. Exemplary organic solvents may include, but are not limited to propandiol-1,2-carbonate, ethylene carbonate, diethylene glycol, propylene carbonate, hexamethylphosphoramide, ethyl acetate, nitrobenzene, formamide, γ-butyrolactone, benzyl alcohol, N-methyl-2-pyrrolidone, acetophenone, ethylene glycol, trifluorophosphate, benzonitrile, valeronitrile, acetonitrile, 3-methoxy propionitrile, dimethylsulfoxide, dimethyl sulfate, aniline, N-methylformamide, phenol, 1,2-dichlorobenzene, tri-n-butyl phosphate, o-dichlorobenzene, cellenium oxychloride, ethylene sulfate, benzenethiol, dimethyl acetamide, N,N-dimethylethaneamide, 3-methoxypropionnitrile, diglyme, cyclohexanol, bromobenzene, cyclohexanone, anisole, diethylformamide, dimethylformamide, 1-hexanethiol, hydrogen peroxide, bromoform, ethyl chloroacetate, 1-dodecanthiol, di-n-butylether, dibutyl ether, acetic anhydride, m-xylene, o-xylene, p-xylene, chlorobenzene, morpholine, diisopropyl etheramine, diethyl carbonate, 1-pentandiol, n-butyl acetate, and 1-hexadecanthiol. Theses organic solvents may be used alone or in a combination of two or more.

Oxidation-reduction derivatives used in the electrolyte 112, which is in a liquid state, may comprise materials capable of providing oxidation/reduction pair, for example, halogenated metal salts such as lithium iodide, sodium iodide, potassium iodide, lithium bromide, sodium bromide, and potassium bromide. Another example of the oxidation-reduction derivatives may include iodides of nitrogen-containing heterocyclic compounds such as imidazolium salts, pyrridinium salts, quaternary ammonium salts, pyrrolidinium salts, pyrazolidinium salts, isothiazolidinium salts, and isooxazolidinium salts. Further, a redox couple together with an organic solvent may also be used as an oxidation-reduction derivative in the electrolyte 112. The redox couple may be $I_3^-/I^-$, $Br^-/Br_2$, $Co(II)/Co(III)$, $SCN^-/(SCN)_2$ or $SeCN^-/(SeCN)_2$, and the organic solvent may be acetonitrile (ACN), valeronitrile, 3-methoxypropionitrile (MPN), 3-methoxypropionitrile, ethylene carbonate, propylene carbonate, dimethyl carbonate, diethyl carbonate, ethyl methyl carbonate, tetrahydrofuran, gamma-butyrolacton, and a combination thereof. In one embodiment, the electrolyte 112 may further include a plurality of additives selected from the group consisting of 4-tert-butylpyridine (TBP), N-methylbenzimidazole (MBI), 1,2-dimethyl-3-propylimidazolium iodide (DMPII), 2,3,4,6-tetra-O-acetyl-β-D-glucopyranosyl isothiocyanate (GITC), and a combination thereof.

In one embodiment, the electrolyte 112, which is in the liquid state, further includes a plurality of functionalized inorganic nanoparticles selected from the group consisting of titanium dioxide, silicon dioxide, zinc oxide, aluminum oxide, cadmium sulfide, zirconium oxide, calcium phosphate, calcium oxide, and a combination thereof. These inorganic nanoparticles may be functionalized with at least one substituent selected from the group consisting of a silane (e.g. trimethoxy(methyl)silane, trimethoxy(vinyl)silane, chloromethyl trimethoxysilane, etc.) an ether (e.g. $C_1$-$C_{20}$ alkyl ether, $C_3$-$C_{20}$ cycloalkyl ether, or $C_6$-$C_{20}$ aryl ether), an amine (e.g. $C_1$-$C_{20}$ alkyl amine, $C_3$-$C_{20}$ cycloalkyl amine, or $C_6$-$C_{20}$ aryl amine, wherein the amine includes a primary, a secondary, and/or a tertiary amine), an ester (e.g. $C_1$-$C_{20}$ alkyl ester, $C_3$-$C_{20}$ cycloalkyl ester, or $C_6$-$C_{20}$ aryl ester), and an amide (e.g. $C_1$-$C_{20}$ alkyl amide, $C_6$-$C_{20}$ aryl amide, $C_1$-$C_{20}$ linear or branched isocyanate amide). These substituents may be covalently coupled to the inorganic nanoparticles from the substituent side. Functional groups on said inorganic nanoparticles may provide a structural steric hindrance effect that prevents aggregation of the inorganic nanoparticles. In one embodiment, the inorganic nanoparticles are suspended in the electrolyte 112, which is in the liquid state, without any sedimentation. In a preferred embodiment, the presence of the inorganic nanoparticles provides a light-scattering of the incident light beam 124 in the electrolyte 112. In one embodiment, the inorganic nanoparticles have a concentration in the range of 0.1 to 20 wt %, preferably 1 to 15 wt %, more preferably 5 to 15 wt %, with weight percent being relative the total weight of the electrolyte. When the concentration of the inorganic nanoparticles is more than 20 wt %, they may aggregate and precipitate. However, when the concentration of the inorganic nanoparticles is less than 0.1 wt %, the light-scattering may be poor. Even so, concentrations of inorganic nanoparticles above 20 wt % and below 0.1 wt % may still be used depending on the particular composition and use of the solar cell. In one embodiment, the inorganic nanoparticles have a diameter in a range of 1 to 100 nm, preferably 1-50 nm, more preferably 5-50 nm. While inorganic nanoparticles having a diameter lower than 1 nm can be used and still function as intended, when the inorganic nanoparticles have a diameter of less than 1 nm, they easily aggregate due to their large specific surface area. In contrast, even though inorganic nanoparticles having a diameter larger than 100 nm can be used, they may not remain suspended in the electrolyte due to a mass and a large volume, thereby they may not effectively scatter the incident light beam 124 in the electrolyte.

The anode 102 and the cathode 104 may be coupled or connected to each other (e.g. face to face) by using an adhesive agent, wherein the electrolyte 112 is present therebetween. The adhesive agent may be a thermoset polymer (e.g. UV or heat-curable epoxies, UV or heat-curable acrylates, or cyanoacrylates). Accordingly, a layer of the adhesive agent is placed between the anode and the cathode and pressure and heat (or UV radiations) are applied thereto. In the embodiment wherein the electrolyte 112 is in the liquid state, and one or more fine holes (or cavities) are formed somewhere on the adhesive agent, and the electrolyte 112 is injected into the gap between the anode 102 and the cathode 104 through said holes (or cavities). Further, an external part of said holes (or cavities) are sealed with an adhesive agent. In the embodiment wherein the electrolyte is in the solid state, the electrolyte is first coated on the anode which already includes the semiconductor layer. Coating the electrolyte may be carried out using a known roll knife coater, a Gravure coater, a die coater, or a reverse coater. Then, the electrolyte may be dried or cured, and finally, the cathode is disposed on the electrolyte via for example roll lamination. In another embodiment, the electrolyte is first coated on the cathode, followed by drying or curing, and finally laminated on the anode. In one embodiment, the electrolyte infiltrates to the semiconductor layer by applying heat.

According to a second aspect the present disclosure relates to a dye-sensitized solar cell, including i) an anode that includes a transparent substrate, and a transparent conductive layer arranged on the transparent substrate, ii) a cathode, iii) a semiconductor layer and a dye absorbed thereon, wherein the semiconductor layer is deposited on the anode, and iv) an electrolyte located between the semiconductor layer and the cathode, wherein the semiconductor layer comprises nanocomposite particles selected from the group consisting of $TiO_2$/ZnO/CdS, $TiO_2$/ZnO/CdSe, $TiO_2$/ZnO/PbS, $TiO_2$/ZnO/PbSe, $TiO_2$/ZnS/CdSe, $TiO_2$/ZnS/PbS, $TiO_2$/ZnS/PbSe, $WO_3$/ZnO/CdSe, $Nb_2O_5$/ZnO/CdSe, and combinations thereof. According to this aspect of the disclosure, the semiconductor layer is in direct contact with the anode, preferably having no gap therebetween, and the electrolyte is disposed in between the semiconductor layer and the cathode. The direct contact of the semiconductor layer with the anode is preferable, as it may facilitate an electron transfer from the excited dye to the conduction band of the semiconductor layer. Further descriptions of the dye-sensitized solar cell in accordance to the second aspect are similar to the dye-sensitized solar cell of the first aspect.

The invention claimed is:

1. A dye-sensitized solar cell, comprising:
an anode comprising
a transparent substrate, and
a transparent conductive layer arranged on the transparent substrate;
a cathode;
a semiconductor layer and a dye adsorbed thereon, wherein the semiconductor layer is arranged between the anode and the cathode in the vicinity to or in contact with the anode; and
an electrolyte located between the anode and the cathode, wherein the semiconductor layer comprises nanocomposite particles in the form of core-intermediate shell-shell quantum dots selected from the group consisting of $TiO_2$/ZnO/CdSe, $TiO_2$/ZnO/PbSe, $TiO_2$/ZnS/CdSe, $TiO_2$/ZnS/PbSe, $WO_3$/ZnO/CdSe, $Nb_2O_5$/ZnO/CdSe, and combinations thereof.

2. The dye-sensitized solar cell of claim 1, wherein the semiconductor layer is deposited on the anode.

3. The dye-sensitized solar cell of claim 1, wherein said nanocomposite particles are core-intermediate shell-shell quantum dots of $TiO_2$/ZnO/CdSe.

4. The dye-sensitized solar cell of claim 1, wherein said nanocomposite particles are core-intermediate shell-shell quantum dots of $TiO_2$/ZnO/PbSe.

5. The dye-sensitized solar cell of claim 1, wherein the anode and the cathode are planar and are disposed parallel and across from one another.

6. The dye-sensitized solar cell of claim 1, wherein the semiconductor layer is porous having a pore diameter in the range of 100 nm-50 µm.

7. The dye-sensitized solar cell of claim 1, wherein a thickness of the semiconductor layer is within the range of 0.5-50 µm.

8. The dye-sensitized solar cell of claim 1, wherein the dye is an anthraquinone-based pigment.

9. The dye-sensitized solar cell of claim 1, wherein the dye is covalently bonded to said nanocomposite particles.

10. The dye-sensitized solar cell of claim 1, wherein the cathode comprises
a second transparent substrate; and
a reflective conducting layer on the second transparent substrate, wherein the reflective conducting layer comprises at least one metal selected from the group consisting of gold, platinum, silver, copper, aluminum, zinc, nickel, iron, tin, and lead.

11. The dye-sensitized solar cell of claim 10, wherein the reflective conducting layer has a reflectance of at least 70%, when being exposed to an incident beam having a wavelength in the range of 300-1,000 nm.

12. The dye-sensitized solar cell of claim 1, wherein the electrolyte consists of at least one halogenated metal salt and an organic solvent.

13. The dye-sensitized solar cell of claim 1, wherein the electrolyte consists of
at least one halogenated metal salt,
an organic solvent, and
functionalized inorganic nanoparticles selected from the group consisting of titanium dioxide, silicon dioxide, zinc oxide, aluminum oxide, cadmium sulfide, zirconium oxide, calcium phosphate, and calcium oxide, which are functionalized with at least one substituent selected from the group consisting of a silane, an ether, an amine, an ester, and an amide.

14. The dye-sensitized solar cell of claim 1, wherein the electrolyte is at least one conductive polymer selected from the group consisting of polypyrrole, polyaniline, polythiophene, poly(3,4-ethylenedioxy-thiophene), poly(3-alkylthiophenes), polyacetylene, polyphenylene vinylene, and polyphenylene sulfide.

15. The dye-sensitized solar cell of claim 1, wherein the electrolyte consists of a crosslinked polymer swollen by an electrolyte solution consisting of an organic solvent having a boiling point of at least 120° C. and at least one halogenated metal salt, wherein the electrolyte solution has a dielectric constant within the range of 1-200.

16. The dye-sensitized solar cell of claim 1, wherein a ratio of the thickness of the semiconductor layer to the thickness of the transparent substrate is 1:5 to 1:15.

17. The dye-sensitized solar cell of claim 1, wherein the core-intermediate shell-shell quantum dots are made of 30-80 weight percent of a core, 10-50 weight percent of an intermediate shell, and 10-30 weight percent of a shell, relative to a total weight of the core-intermediate shell-shell quantum dots, and wherein the intermediate shell is disposed between the core and the shell.

18. The due sensitized solar cell of claim 1, which has a nanocomposite particle loading of 60-80 mg per $mm^2$ of the anode.

19. The dye-sensitized solar cell of claim 1, wherein a weight ratio of the dye to the nanocomposite particles is from 1:100-5:100.

\* \* \* \* \*